(12) United States Patent
Lee et al.

(10) Patent No.: US 9,786,371 B1
(45) Date of Patent: Oct. 10, 2017

(54) POWER-ON RESET CIRCUIT WITH VARIABLE DETECTION REFERENCE AND SEMICONDUCTOR MEMORY DEVICE INCLUDING THE SAME

(71) Applicant: SK hynix Inc., Gyeonggi-do (KR)

(72) Inventors: Hyun Chul Lee, Seoul (KR); Yeong Joon Son, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/290,702

(22) Filed: Oct. 11, 2016

(30) Foreign Application Priority Data

May 30, 2016 (KR) ........................ 10-2016-0066584

(51) Int. Cl.
G11C 15/00 (2006.01)
G11C 15/04 (2006.01)
G11C 7/12 (2006.01)
G11C 5/14 (2006.01)

(52) U.S. Cl.
CPC ............ *G11C 15/046* (2013.01); *G11C 5/143* (2013.01); *G11C 5/147* (2013.01); *G11C 7/12* (2013.01)

(58) Field of Classification Search
CPC ....... G11C 11/4094; G11C 7/12; G11C 5/147; G11C 5/143; H03K 17/223; H03K 17/22; H03K 17/24
USPC .................. 365/49.1, 168, 226; 327/142, 143
See application file for complete search history.

(56) References Cited

U.S. PATENT DOCUMENTS

| | | | | |
|---|---|---|---|---|
| 6,081,468 A * | 6/2000 | Taira | ........................ | G11C 7/12 365/203 |
| 6,194,920 B1 * | 2/2001 | Oguri | ...................... | H03F 3/303 327/563 |
| 6,492,850 B2 * | 12/2002 | Kato | ........................ | G05F 1/465 327/143 |
| 6,825,701 B2 * | 11/2004 | Akiyoshi | ................ | H03K 17/22 327/143 |
| 6,937,074 B2 * | 8/2005 | Shin | ...................... | H03K 17/223 327/143 |
| 8,237,414 B1 * | 8/2012 | Li | ............................ | H02J 7/0003 320/103 |
| 2004/0012418 A1 * | 1/2004 | Kim | ...................... | H03K 17/223 327/143 |
| 2006/0103437 A1 * | 5/2006 | Kang | .................... | H03K 17/223 327/143 |

FOREIGN PATENT DOCUMENTS

| KR | 1020050119078 | 12/2005 |
|---|---|---|
| KR | 1020170006980 | 1/2017 |

* cited by examiner

*Primary Examiner* — Gene Auduong
(74) *Attorney, Agent, or Firm* — IP & T Group LLP

(57) ABSTRACT

Provided herein are a power-on reset circuit and a semiconductor memory device including the same. The power-on reset circuit may include: a voltage dividing circuit suitable for dividing an external power supply voltage to output a reference voltage, an output node control circuit suitable for controlling a potential level of an output node to an external power supply voltage level or a ground power supply voltage level in response to the reference voltage, and a buffer circuit suitable for buffering the potential level of the output node to output a power-on reset signal. In the voltage dividing circuit, a potential level of the reference voltage in a power up period is different from a potential level of the reference voltage in a power down period.

20 Claims, 7 Drawing Sheets

POWER-ON RESET CIRCUIT WITH VARIABLE DETECTION REFERENCE AND SEMICONDUCTOR MEMORY DEVICE INCLUDING THE SAME

CROSS-REFERENCE TO RELATED APPLICATION

The present application claims priority under 35 U.S.C. §119(a) to Korean patent application number 10-2016-0066584 filed on May 30, 2016, which is incorporated herein in its entirety by reference.

BACKGROUND

Field of Invention

Various embodiments of the present disclosure relate generally to an electronic device and, more particularly, to a power-on reset circuit and a semiconductor memory device including the same.

Description of Related Art

Semiconductor memory devices are memory devices implemented with using a semiconductor, such as silicon (Si), germanium (Ge), gallium arsenide (GaAs), indium phosphide (InP), silicon-germanium (SiGe) or the like. The semiconductor memory devices are generally classified into volatile and nonvolatile memory devices.

A volatile memory device is a memory device in which data stored therein is lost when power is turned off. Examples of a volatile memory device include a static random access memory (SRAM), a dynamic RAM (DRAM), a synchronous DRAM (SDRAM), or the like. A nonvolatile memory device is a memory device in which data stored therein is maintained even when power is turned off. Examples of a nonvolatile memory device include a read only memory (ROM), a programmable ROM (PROM), Electrically Programmable ROM (EPROM), an Electrically Erasable and Programmable ROM (EEPROM), a Flash memory, a Phase-change RAM (PRAM), a Magnetic RAM (MRAM), a Resistive RAM (RRAM), a Ferroelectric RAM (FRAM), or the like. Flash memories are generally classified into NOR and NAND flash memories.

Typically, a semiconductor memory device has a power-on reset (POR) circuit embedded therein which generates a POR signal. The semiconductor memory device is prevented from malfunctioning by generating the POR signal for initializing an internal circuit when power is inputted to the device.

SUMMARY

Various embodiments of the present disclosure are directed to a power-on reset circuit capable of performing an improved, more stable power-on reset operation and word line discharge operation, and a semiconductor memory device including the same.

One embodiment of the present disclosure provides a power-on reset circuit including: a voltage dividing circuit configured to divide an external power supply voltage to output a reference voltage; an output node control circuit suitable for controlling a potential level of an output node to an external power supply voltage level or a ground power supply voltage level in response to the reference voltage; and a buffer circuit suitable for buffering the potential level of the output node to output a power-on reset signal, wherein a potential level of the reference voltage in a power up period is different from a potential level of the reference voltage in a power down period.

Another embodiment of the present disclosure provides a power-on reset circuit including: a content addressable memory (CAM) circuit configured to output a down signal in response to a power-on reset signal; a voltage dividing circuit configured to divide an external power supply voltage according to a resistance ratio to output a reference voltage, the resistance ratio being changed in response to the down signal; an output node control circuit suitable for controlling a potential level of an output node to an external power supply voltage level or a ground power supply level in response to the reference voltage; and a buffer circuit suitable for buffering the potential level of the output node to output the power-on reset signal, wherein the CAM circuit controls a logic level of the down signal according to a program state of a content addressable memory (CAM) cell among a plurality of memory cells.

Still another embodiment of the present disclosure provides a semiconductor memory device including: a power-on reset circuit configured to output a power-on reset signal with a first logic level when an external power supply voltage increases to a first set level or higher in a power up period, and to output the power-on reset signal with a second logic level when the external power supply voltage decreases to a second set level or lower in a power down period; and an external voltage detecting unit configured to output a detection signal when the external power supply voltage decreases to a third set level or lower.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Figure 1:
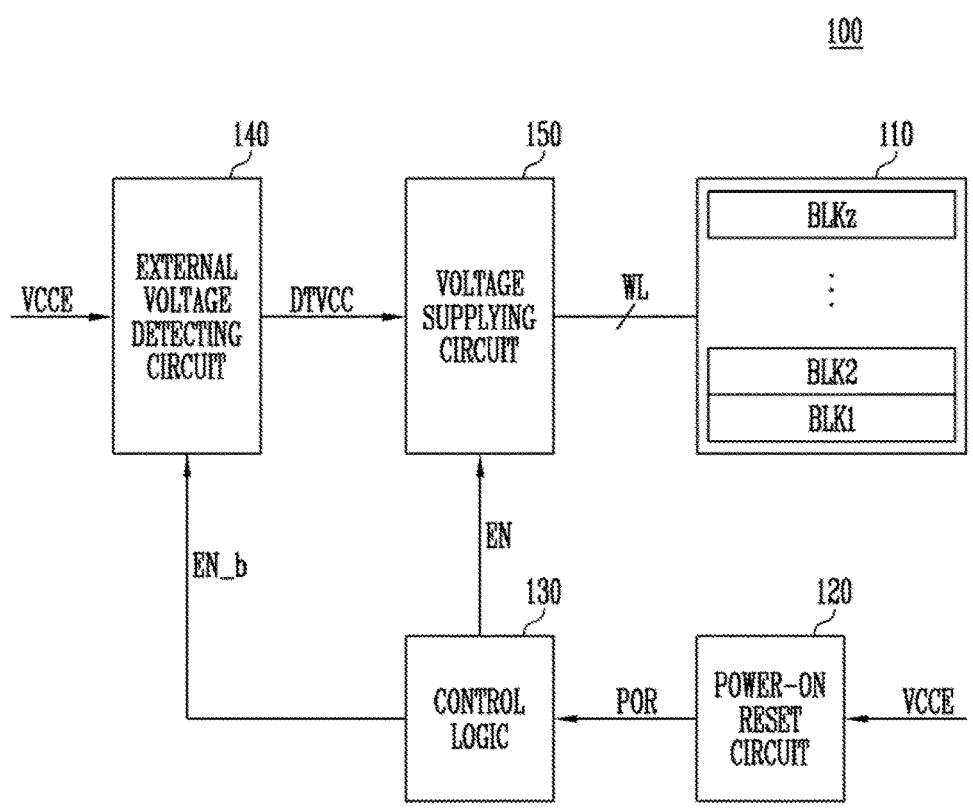
FIG. 1 is a block diagram illustrating a semiconductor memory device including a power-on reset circuit, according to an embodiment of the present disclosure.

Although the present invention is described with reference to specific embodiments, it is to be noted that the present invention may also be embodied in different forms and should not therefore, be construed as being limited to the embodiments set forth herein. Rather, these embodiments are provided so that this disclosure will be thorough and complete, and will fully convey the present invention to those skilled in the art to which the present invention pertains.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural form as long as it is not specifically mentioned otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Furthermore, unless defined otherwise, all the terms used in this specification including technical and scientific terms have the same meanings as would be generally understood by those skilled in the related art in view of the present disclosure. The terms defined in generally used dictionaries should be construed as having the same meanings as would be construed in the context of the present disclosure and the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Advantages and features of the present invention, and methods for achieving the same will be cleared with reference to exemplary embodiments described later in detail together with the accompanying drawings. Accordingly, the present invention is not limited to the following embodiments but embodied in other types. Rather, these embodiments are provided so that this disclosure will be thorough, and convey the technical idea of the present disclosure to those skilled in the art.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Referring now to FIG. 1, a semiconductor memory device 100 is provided, according to an embodiment of the present disclosure.

The semiconductor memory device 100 includes a memory cell array 110, a power-on reset circuit 120, a control logic 130, an external voltage detecting circuit 140, and a voltage supplying circuit 150.

The memory cell array 110 includes a plurality of memory blocks BLK1 to BLKz. The memory blocks BLK1 to BLKz are coupled to the voltage supplying circuit 150 through a plurality of word lines WL. Each of the plurality of memory blocks BLK1 to BLKz includes a plurality of memory cells. As an example, the plurality of memory cells are nonvolatile memory cells, and in particular, the plurality of memory cells may be charge trap device-based nonvolatile memory cells. Memory cells coupled to an identical word line among the plurality of memory cells are defined as one page. In other words, the memory cell array 110 employs a plurality of pages. In addition, each of the memory blocks BLK1 to BLKz of the memory cell array 110 includes a plurality of memory strings. Each of the plurality of memory strings includes a drain selection transistor cell directly coupled between a bit line and a source line, a plurality of memory cells, and a source selection transistor cell.

In an embodiment of the present disclosure, at least one (e.g., BLKz) of the plurality of memory blocks BLK1 to BLKz may be a content addressable memory (CAM) block. In another embodiment, all the plurality of memory blocks BLK1 to BLKz may be normal memory blocks, and each of the plurality of memory blocks BLK1 to BLKz may be configured to include normal memory cells and CAM cells.

When an external power supply voltage VCCE supplied from the outside of a semiconductor memory device is increased to a level equal to or greater than a first set level at the time of powering up (POWER UP), the power-on reset circuit 120 generates and outputs a power-on reset signal POR with a first logic level. In addition, when the external power supply voltage VCCE is decreased to a level equal to or less than a second set level at the time of powering down (POWER DOWN), the power-on reset circuit 120 generates and outputs a power-on reset signal POR with a second logic level. Then, when the external power supply voltage VCCE is further decreased, the power-on reset circuit 120 is disabled. In other words, the power-on reset circuit 120 generates and outputs a power-on reset signal POR by using different detecting reference levels at the time of POWER UP and POWER DOWN. The second set level may be lower than the first set level.

The control logic 130 generates and outputs an enable signal EN_b for activating the external voltage detecting circuit 140 and an enable signal EN for activating the voltage supplying circuit 150. In addition, the control logic 130 is reset in response to the power-on reset signal POR received from the power-on reset circuit 120.

The external voltage detecting circuit 140 is activated in response to the enable signal EN_b received from the control logic 130. When the external power supply voltage VCCE is powered down and the potential level thereof is lowered to a third set level, the external voltage detecting circuit 140 detects this and outputs a detection signal DTVCC. At this point, the third set level may be set to be higher than the second set level and lower than the first set level.

The voltage supplying circuit 150 generates operation voltages to be applied to the word lines WL of the memory cell array 110 in response to the enable signal EN received from the control logic 130. In addition, when the external power supply voltage VCCE is powered down, the voltage supplying unit 150 discharges the potential level of the word line WL to a ground voltage level in response to the detection signal DTVCC received from the external voltage detecting circuit 140. At this point, in a case where a timing when a detection signal DTVCC is outputted at the time of POWER DOWN is later than a timing when a power-on reset signal POR with the second logic level is received from the power-on reset circuit 120, the voltage supplying circuit 150 may become deactivated before performing the discharge operation and an error may occur in the discharge operation.

At the time of POWER DOWN, the power-on reset circuit 120 of the semiconductor memory device 100 outputs a power-on reset signal POR by using the third set level, which is higher than the second set level, as a detection reference level. Accordingly, when the external power supply voltage VCCE is lower than the third set level but is higher than the second set level at the time of POWER DOWN, the power-on reset circuit 120 outputs a power-on reset signal POR corresponding to a power-on operation. Accordingly, the control logic 130 continuously outputs the enable signal EN for activating the voltage supplying circuit 150 and the voltage supplying circuit 150 maintains an activation state in response to the enable signal EN. At this point, the external voltage detecting circuit 140 may output the detection signal DTVCC, and the voltage supplying circuit 150 may stably perform an operation for discharging the word lines WL in response to the detection signal DTVCC.

Figure 2:
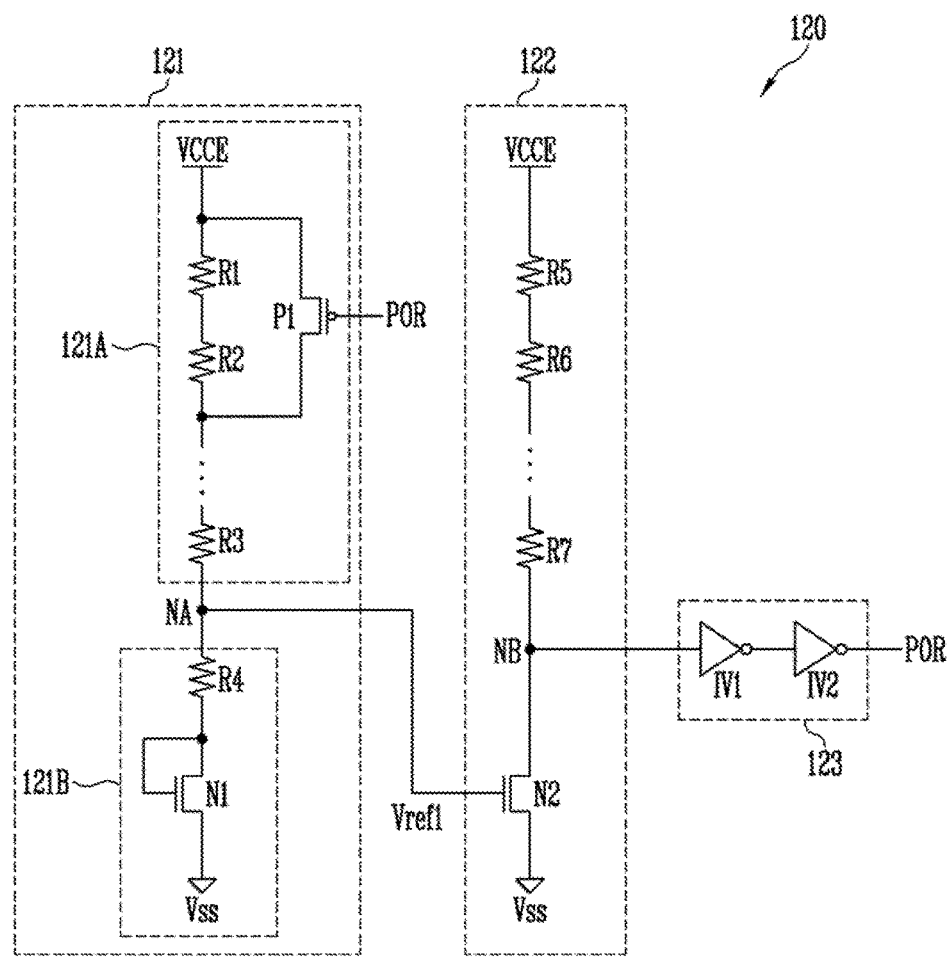
FIG. 2 is a circuit diagram illustrating the power-on reset circuit of FIG. 1, according to an embodiment of the present disclosure.

FIG. 2 is an example of a circuit diagram for the power-on reset circuit 120 of FIG. 1.

Referring to FIG. 2, the power-on reset circuit 120 includes a voltage dividing circuit 121, an output node control circuit 122, and a buffer circuit 123.

The voltage dividing circuit 121 includes first and second resistor circuits 121A and 121B. The voltage dividing circuit 121 divides the external power supply voltage VCCE according to a ratio of resistance values of the first and second resistor circuits 121A and 121B and outputs the divided voltage as a reference voltage Vref1.

The first resistor circuit 121A includes a plurality of resistors R1 to R3 and a transistor P1. Transistor P1 is a PMOS transistor. The plurality of resistors R1 to R3 are serially coupled between a terminal for the external power supply voltage VCCE and an internal node NA. The transistor P1 is coupled between a node between the resistors R2 and R3 and the terminal for the external power supply voltage VCCE, and is turned on or off in response to the power-on reset signal POR. Accordingly, the resistance value of the first resistor circuit 121A varies according to a logic level of the power-on reset signal POR. For example, when the power-on reset signal POR is a high level, the resistance value of the first resistor circuit 121A is a total sum of the plurality of resistors R1 to R3. When the power-on reset signal POR is a low level, the resistance value of the first resistor circuit 121A is reduced from the total sum of the plurality of resistors R1 to R3 by the sum of the resistance values of the resistors R1 and R2.

The second resistor circuit 121B includes a resistor R4 and a transistor N1 serially coupled between an internal node NA and a terminal for a ground power supply voltage Vss. The transistor N1 has a diode connection structure and a constant resistance value. Accordingly, the second resistor circuit 121B has a fixed resistance value corresponding to the sum of the resistance values of the resistor R4 and the transistor N1. Transistor N1 is an NMOS transistor.

The voltage dividing circuit 121 changes the potential level of the reference voltage Vref1 according to a logic level of the power-on reset signal POR and outputs the changed potential level. For example, the potential level of the reference voltage Vref1 outputted when the power-on reset signal POR is a low logic level is higher than the potential level of the reference voltage Vref1 outputted when the power-on reset signal POR is a high logic level. The adjusted potential level of the reference voltage Vref1 may be changed by adjusting a variable resistance value of the first resistor circuit 121A.

The output node control circuit 122 includes a plurality of resistors R5 to R7 and a transistor N2. Transistor N2 is an NMOS transistor. The plurality of resistors R5 to R7 is serially coupled between the terminal for the external power supply voltage VCCE and an internal node NB. The transistor N2 is coupled between the internal node NB and the terminal for the ground power supply voltage Vss. The transistor N2 couples the internal node NB with the ground power supply voltage Vss in response to the reference voltage Vref1 to discharge a potential of the internal node NB or to block the electrical coupling between the internal node NB and the ground power supply voltage Vss.

When the reference voltage Vref1 is lower than a threshold voltage of the transistor N2, the potential level of the internal node NB becomes increased by the external power supply voltage VCCE. On the other hand, when the reference voltage Vref1 is higher than the threshold voltage N2, the node NB is coupled with the ground power supply voltage Vss.

The buffer circuit 123 buffers the potential level of the internal node NB to generate the power-on reset signal POR, and outputs the power-on reset signal POR.

The buffer circuit 123 may be configured by including inverters IV1 and IV2 serially coupled with the internal node NB. When the potential level of the Internal node NB increases to a certain potential level or higher, the buffer circuit 123 buffers the potential level to output a power-on reset signal POR with a high logic level. The buffer circuit 123 outputs a power-on reset signal POR with a low logic level when the potential level of the internal node NB is lower than the certain potential level.

Figure 3:
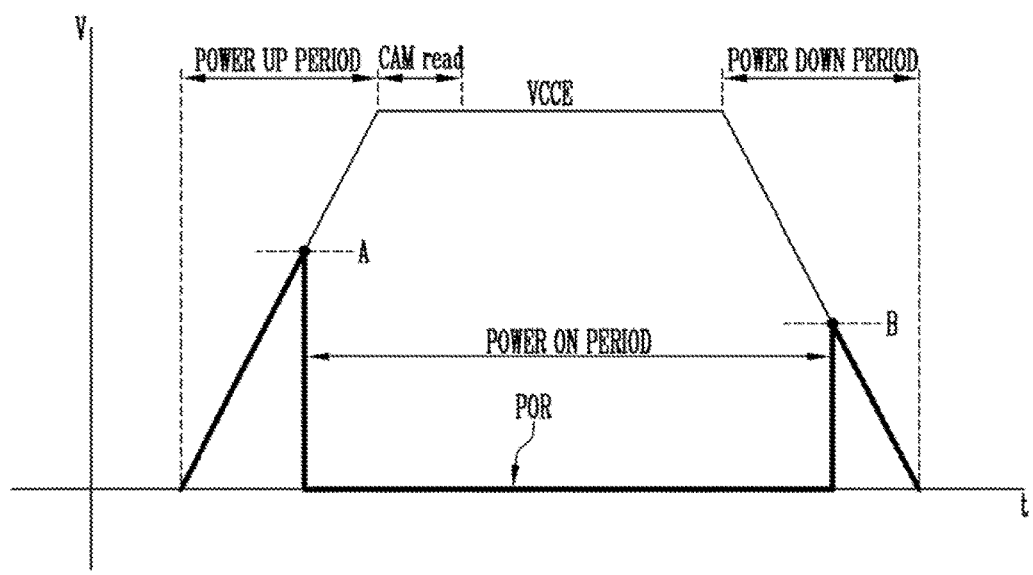
FIG. 3 is a signal waveform diagram illustrating an operation method of a power-on reset circuit, according to an embodiment of the present disclosure.

FIG. 3 is a signal waveform diagram illustrating an operation of a power-on reset circuit, according to an embodiment of the present disclosure.

An operation of the power-on reset circuit will be described with reference to FIGS. 2 and 3.

When the external power supply voltage VCCE increases in a power up period, the voltage dividing circuit 121 divides the external power supply voltage VCCE to output a reference voltage Vref1 through the internal node NA. At this point, the reference voltage Vref1 increases in proportion to the external power supply voltage VCCE. The voltage dividing circuit 121 divides the external power supply voltage VCCE according to a ratio of resistance values of the first and second resistor circuits 121A and 121B and outputs the divided voltage as the reference voltage Vref1.

When the external power supply voltage VCCE continuously increases beyond a first set level A, the output node control circuit 122 controls the potential level of the internal node NB to the ground power supply voltage Vss in response to the reference voltage Vref1 which is generated by dividing the external power supply voltage VCCE. Accordingly, the buffer circuit 123 buffers the potential level of the internal node NB to generate a power-on reset signal POR with a low logic level, and outputs the power-on reset signal POR.

In response to the power-on reset signal POR with the low logic level, a total resistance value of the first resistor circuit 121A of the voltage dividing circuit 121 decreases by a set value (e.g., a sum of resistance values of the resistors R1 and R2). Accordingly, the potential level of the reference voltage Vref1, which is generated by dividing the external power supply voltage VCCE according to the resistance ratio, increases.

The external power supply voltage VCCE is supplied at a certain level and the potential level thereof decreases in a power down period. Accordingly, the potential level of the internal node NA, namely, the potential level of the reference voltage Vref1 may decrease. When the external power supply voltage VCCE gradually decreases, the potential level of the reference voltage Vref1 received from the voltage dividing circuit 121 also decreases. When the external power supply voltage VCCE decreases to a second set level B or lower, the transistor N2 of the output node control circuit 122 is turned off in response to the reference voltage Vref1. Accordingly, the internal node NB is electrically blocked from the ground power supply voltage Vss and the potential level thereof is increased by the external power supply voltage VCCE. In addition, the buffer circuit 123 buffers the potential level of the internal node NB to generate a power-on reset signal POR with a high logic level and outputs the generated power-on reset signal POR. As the external power supply voltage VCCE continuously decreases, the potential level of the power-on reset signal POR also continuously decreases.

As described above, in an embodiment of the present disclosure, the resistance value of the first resistor circuit 121A may be set differently at the time of power up operation and power down operation. For example, when the resistance value at the time of power down operation is controlled to be lower than that at the time of power up operation, it is possible to set so that the potential level (i.e., a first set level A) of the external power supply voltage VCCE at the time when the power-on reset signal POR is transitioned to a low level at the time of power up operation is higher than the potential level (I.e., a second set level B) of the external power supply voltage VCCE at the time when the power-on reset signal POR is transitioned to a high level at the time of power down operation.

Figure 4:
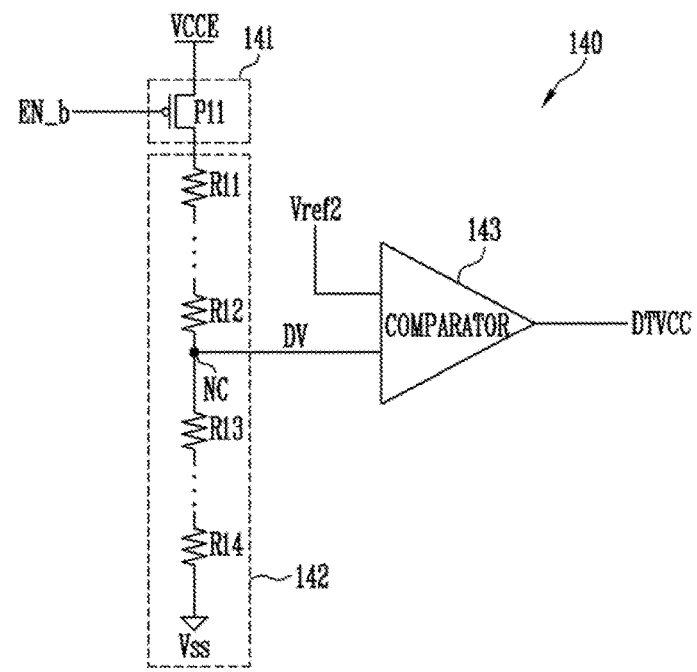
FIG. 4 is a circuit diagram illustrating the external voltage detecting unit of FIG. 1, according to an embodiment of the present disclosure.

FIG. 4 is a circuit diagram example illustrating the external voltage detecting unit 140 of FIG. 1.

Referring to FIG. 4, the external voltage detecting circuit 140 includes an activating circuit 141, a voltage dividing circuit 142, and a signal generating circuit 143.

The activating circuit 141 includes a transistor P11 and supplies the external power supply voltage VCCE to the voltage dividing circuit 142 in response to the enable signal EN_b.

The voltage dividing circuit 142 includes a plurality of serially coupled resistors R11 to R14, and divides the external power supply voltage VCCE supplied through the activating circuit 141 according to a resistance ratio to output the divided voltage DV through an internal node NC.

The signal generating circuit 143 may be configured from a comparator. The signal generating circuit 143 compares the divided voltage DV with a reference voltage Vref2 to output a detection signal DTVCC. For example, when the divided voltage DV is smaller than the reference voltage Vref2, the detection signal DTVCC with a high level is outputted.

Figure 5:
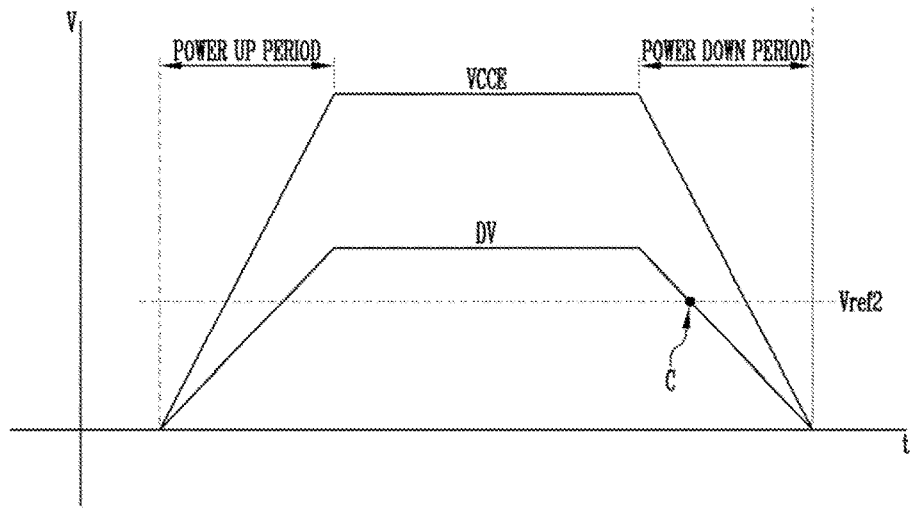
FIG. 5 is a signal waveform diagram illustrating an operation of an external voltage detecting circuit, according to an embodiment of the present disclosure.

FIG. 5 is a signal waveform diagram illustrating an operation of an external voltage detecting circuit, according to an embodiment of the present disclosure.

The external voltage detecting circuit 140 according to an embodiment of the present disclosure will be described with reference to FIGS. 4 and 5.

The activating circuit 141 applies the external power supply voltage VCCE to the voltage dividing circuit 142 in response to the enable signal EN_b that is activated at a low level after a power-on operation.

The voltage dividing circuit 142 divides the external power supply voltage VCCE according to a resistance ratio to output the divided voltage DV through the internal node NC. The resistance ratio of the voltage dividing circuit 142 is adjusted so that the divided voltage DV is higher than the reference voltage Vref2, when the external power supply voltage VCCE is maintained at a certain level.

Thereafter, when the external power supply voltage VCCE is powered down, the potential level of the divided voltage DV decreases. When the divided voltage DV is lower than the reference voltage Vref2, the detection signal DTVCC with a high level is outputted. The level of the external power supply voltage VCCE at the time when the detection signal DTVCC with the high level is outputted may be defined as a third set level C. The third set level C may be set to be higher than the second set level and to be lower than the first set level of the power-on reset circuit described in relation to FIGS. 2 and 3. The third set level may be set by adjusting the potential level of the reference voltage Vref3. For example, when the reference voltage Vref2 increases, the detection signal DTVCC with a high level is outputted when the external power supply voltage VCCE has a relatively high potential level. In case where the reference voltage Vref2 decreases, the detection signal DTVCC with a high level is outputted when the external power supply voltage VCEE has a relatively low potential level.

Figure 6:
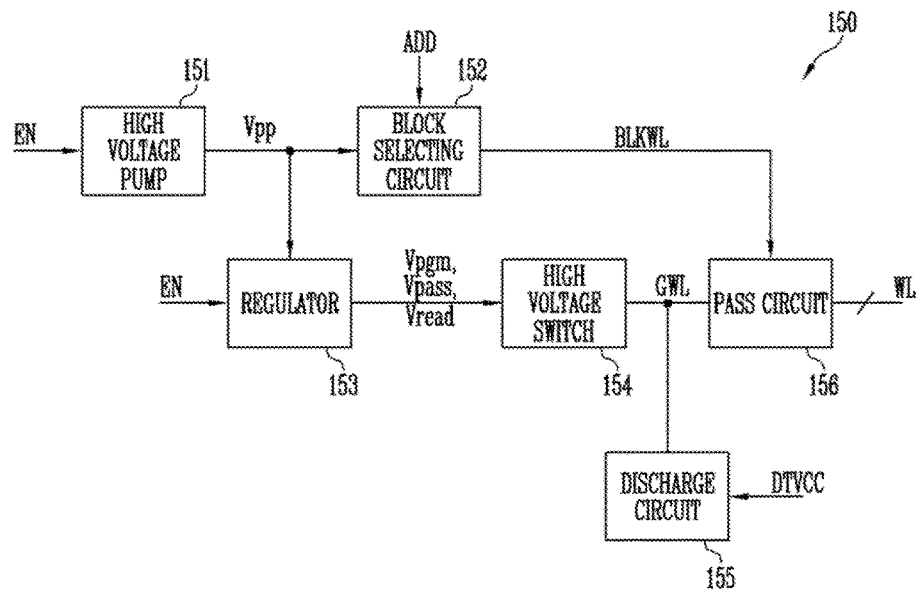
FIG. 6 is a detailed block diagram illustrating the voltage supplying circuit of FIG. 1, according to an embodiment of the present disclosure.

FIG. 6 illustrates a voltage supplying circuit 150 of FIG. 1.

Referring to FIG. 6, the voltage supplying circuit 150 includes a high voltage pump 151, a block selecting circuit 152, a regulator 153, a high voltage switch 154, a discharge circuit 155, and a pass circuit 156.

The high voltage pump 151 is activated in response to the enable signal EN received from the control logic 130, performs a pumping operation to generate a high voltage Vpp, and outputs the high voltage Vpp.

The block selecting circuit 152 receives the high voltage Vpp received from the high voltage pump 151 to output a block selection signal BLKWL corresponding to at least one of a plurality of memory blocks included in the memory cell array in response to an address signal ADD. The block selection signal BLKWL may have the potential level with the high voltage Vpp.

The regulator 153 receives the high voltage Vpp from the high voltage pump 151 to generate a plurality of operation voltages such as a program voltage Vpgm, a pass voltage Vpass, a read voltage Vread, or the like, by using the high voltage Vpp.

The high voltage switch 154 transmits the plurality of operation voltages (e.g., Vpgm, Vpass, and Vread), which are received from the regulator 153 through global word lines GWL to the pass circuit 156.

The discharge circuit 155 is coupled to the global word lines GWL and discharges the potential level of the word lines WL coupled through the pass circuit 156 in response to the detection signal DTVCC at the time of POWER DOWN.

The pass circuit 156 couples the global word lines GWL with the word lines WL in response to the block selection signal BLKWL received from the block selecting circuit 152.

An operation of a semiconductor memory device according to an embodiment of the present disclosure will be described with reference to FIGS. 1 to 6.

When the external power supply voltage VCCE increases to a level equal to or higher than the first set level A in a power up period, the power-on reset circuit 120 detects this to output a power-on reset signal POR of a low logic level.

The control logic 130 outputs an enable signal EN_b for activating the external voltage detecting circuit 140 and an enable signal EN for activating the voltage supplying circuit 150 in response to the power-on reset signal POR with the low logic level.

The high voltage pump 151 of the voltage supplying circuit 150 is activated in response to the enable signal EN received from the control logic 130, and performs a pumping operation to generate the high voltage Vpp and to output the high voltage Vpp to the block selecting circuit 152 and to the regulator 153.

The block selecting circuit 152 receives the high voltage Vpp from the high voltage pump 151 and outputs the block selection signal BLKWL corresponding to at least one of the plurality of memory blocks BLK1 to BLKz included in the memory cell array 110 in response to the address signal ADD inputted into the block selecting circuit 152.

The regulator 153 receives the high voltage Vpp from the high voltage pump 151 to generate the plurality of operation voltages such as a program voltage Vpgm, a pass voltage Vpass, a read voltage Vread, or the like, by using the high voltage Vpp.

The high voltage switch 154 transmits the plurality of operation voltages Vpgm, Vpass, and Vread, which are received from the regulator 153, to global word lines GWL coupled to the pass circuit 156.

The pass circuit 156 couples the global word lines GWL with the word lines WL to apply the plurality of operation voltages (e.g., Vpgm, Vpass, and Vread) to the word lines WL in response to the block selection signal BLKWL received from the block selecting circuit 152.

Thereafter, when the external power supply voltage VCCE having been maintained at the certain level gradually decreases, the external voltage detecting circuit 140 detects that the external power supply voltage VCCE decreases to the third set level C or lower to output the detection signal DTVCC. At this point, the third set level C is higher than the second set level B.

The discharge circuit 155 of the voltage supplying circuit 150 discharges the potential level of the word lines WL coupled through the pass circuit 156 in response to the detection signal DTVCC.

Thereafter, when the external power supplying voltage VCCE further decreases to the second set level B or lower, the power-on reset circuit 120 allows the power-on reset signal POR to be transitioned from a low logic level to a high logic level and outputs the level-transitioned power-on reset signal POR.

The control logic 130 deactivates the enable signal EN_b and the enable signal EN in response to the power-on reset signal POR with the high logic level and accordingly operations of the external voltage detecting circuit 140 and voltage supplying circuit 150 are disabled.

As describe above, according to the above-described technique, a detection reference level of the external power supplying voltage VCCE, which is detected by the external voltage detecting circuit 140 at the time of power down, is set to be higher than a detection reference level of the external power supplying voltage VCCE, which is detected by the power-on reset circuit 120 at the time of power down, so that a word line discharge operation may be stably performed in the power down period.

Figure 7:
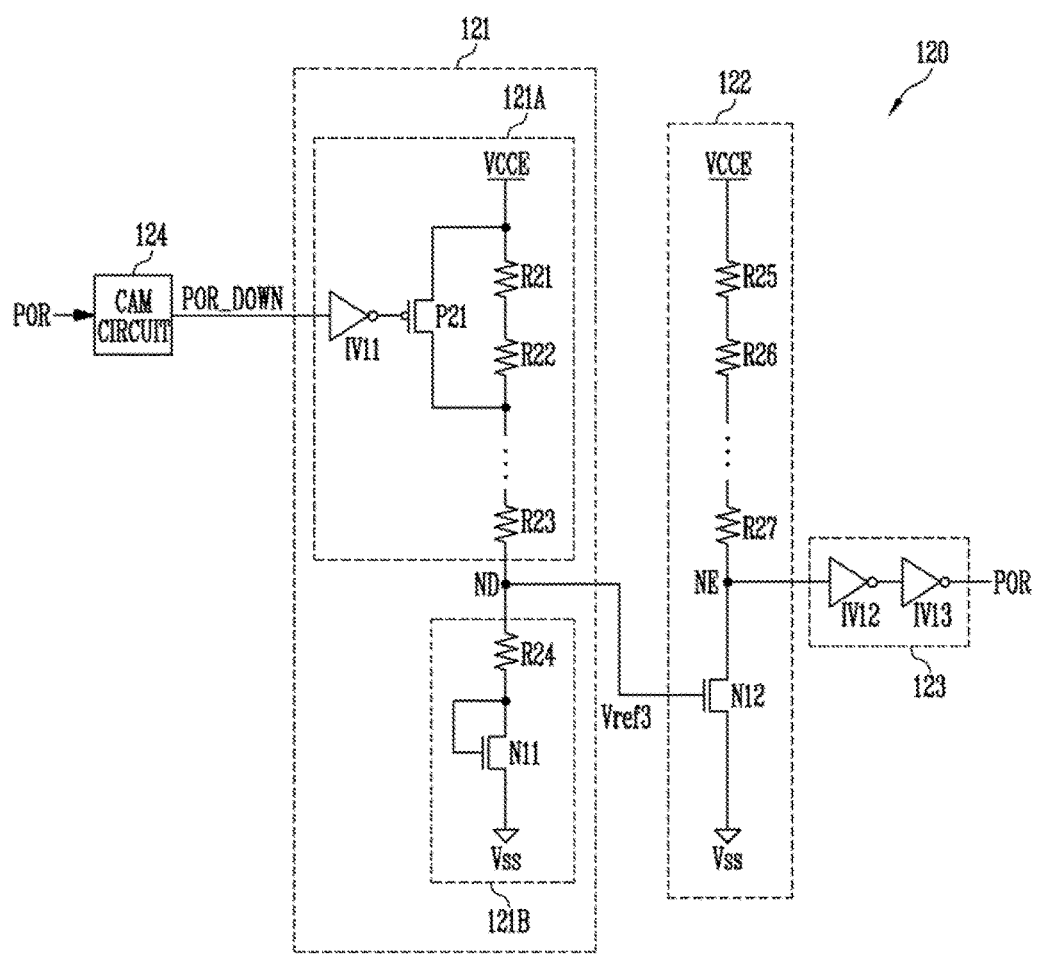
FIG. 7 is a detailed circuit diagram illustrating another embodiment of the power-on reset circuit of FIG. 1.

FIG. 7 illustrating another embodiment of the power-on reset circuit 120 of FIG. 1.

Referring to FIG. 7, the power-on reset circuit 120 includes a voltage dividing circuit 121, an output node control circuit 122, a buffer circuit 123, and a content addressable memory (CAM) circuit 124.

The voltage dividing circuit 121 includes first and second resistor circuits 121A and 121B. The voltage dividing circuit 121 divides the external power supply voltage VCCE according to a ratio of resistance values of the first and second resistor circuits 121A and 121B and outputs the divided voltage as a reference voltage Vref3.

The first resistor circuit 121A includes a plurality of resistors R21 to R23, a transistor P21, and an inverter IV11. The transistor P21 is a PMOS transistor. The plurality of resistors R21 to R23 are serially coupled between the terminal for the external power supply voltage VCCE and an internal node ND. The inverter IV11 inverts a down signal POR_DOWN received from the CAM circuit 124 and outputs the inverted down signal. The transistor P21 is coupled between a node between the resistors R22 and R23 and the terminal for the external power supply voltage VCCE, and is turned on or off in response to a signal received from the inverter IV11. Accordingly, the resistance value of the first resistor circuit 121A varies according to the logic level of the down signal POR_DOWN received from the CAM circuit 124. For example, when the down signal POR_DOWN is a low level, the resistance value of the first resistor circuit 121A is a total sum of the plurality of resistors R21 to R23. When the down signal POR_DOWN is a high level, the resistance value of the first resistor circuits 121A is decreased from the total sum of the plurality of resistors R21 to R23 by the sum of the resistance values of the resistors R21 and R22.

The second resistor circuit 1215 includes a resistor R24 and a transistor N11 serially coupled between the internal node ND and the terminal for the ground power supply voltage Vss. The transistor N11 has a diode connection structure and a constant resistance value. Accordingly, the second resistor circuit 121B has a fixed resistance value corresponding to the sum of the resistance values of the resistor R24 and the transistor N11.

The voltage dividing circuit 121 changes the potential level of the reference voltage Vref3 according to the logic level of the down signal POR_DOWN and outputs the changed potential level. For example, the potential level of the reference voltage Vref2, which is outputted when the logic level of the down signal POR_DOWN is a low logic level, is higher than that of the reference voltage Vref3 outputted when the down signal POR_DOWN is a high logic level.

The output node control circuit 122 includes a plurality of resistors R25 to R27 and a transistor N12. The plurality of resistors R25 to R27 is serially coupled between the terminal for the external power supply voltage VCCE and an internal node NE. The transistor N12 is coupled between the internal node NE and the terminal for the ground power supply voltage Vss, and couples the internal node NE with the ground power supply Vss in response to the reference voltage Vref3 to discharge a potential of the internal node NE or to block the electrical coupling between the internal node NE and the ground power supply voltage Vss.

When the reference voltage Vref3 is lower than a threshold voltage of the transistor N12, the potential level of the Internal node NE becomes increased by the external power supply voltage VCCE. On the other hand, when the reference voltage Vref3 is higher than the threshold voltage N12, the node NE is coupled to the ground power supply voltage Vss.

The buffer circuit 123 buffers the potential level of the internal node NE to generate a power-on rest signal POR, and outputs the power-on reset signal POR.

The buffer circuit 123 includes inverters IV12 and IV13 serially coupled to the internal node NE. When the potential level of the internal node NE increases to a certain potential level or higher, the buffer circuit 123 buffers the potential level to output the power-on reset signal POR with a high logic level. The buffer circuit 123 outputs the power-on reset signal POR with a low logic level when the potential level of the internal node NE is lower than the certain potential level.

The CAM circuit 124 performs a CAM cell read operation in response to the power-on reset signal POR and outputs the down signal POR_DOWN to the CAM cell according to program data. The CAM circuit 124 is configured from at least one CAM cell and the CAM cell may be programmed with set data values. For example, the CAM circuit 124 may program data of '1' or '0' in the CAM cell to set the logic level of the down signal POR_DOWN outputted by the CAM cell read operation.

Before the power-on reset signal POR is transitioned from a high level to a low level in a power up period, the CAM circuit 124 does not perform the CAM read operation and becomes in a default state. In the default state, the CAM circuit 124 may be designed to allow the down signal POR_DOWN to have a low level.

The CAM circuit 124 may be configured from CAM blocks or CAM cells included in the memory cell array 110 of FIG. 1.

An operation of the power-on reset circuit will be described with reference to FIGS. 3 and 7.

In an embodiment of the present disclosure, a description will be exemplarily provided about a case where the CAM circuit 124 is set to output a down signal POR_DOWN of a high level in response to a low level power-on reset signal POR.

When the external power supply voltage VCCE increases in a power up period, the voltage dividing circuit 121 divides the external power supply voltage VCCE to output the reference voltage Vref3 through the internal node ND. In other words, the voltage dividing circuit 121 divides the external power supply voltage VCCE according to a ratio of resistance values of the first and second resistor circuits 121A and 121B and outputs the divided voltage as the reference voltage Vref3.

When the external power supply voltage VCCE continuously increases beyond the first set level A, the output node control circuit 122 controls a potential level of the internal node NE to the ground power supply voltage Vss in response to the reference voltage Vref3 which is generated by dividing the external power supply voltage VCCE. Accordingly, the buffer circuit 123 buffers the potential level of the internal node NE to generate the power-on reset signal POR with a low logic level, and outputs the power-on reset signal POR.

In response to the power-on reset signal POR with the low logic level, the CAM circuit 124 performs a CAM cell read operation and outputs a power down signal POR_DOWN with a high level according to the read CAM cell data.

In response to the down signal POR_DOWN with the high level, a total resistance value of the first resistor circuit 121A of the voltage dividing circuit 121 decreases by a set value (e.g., a sum of resistance values of the resistors R21 and R22). Accordingly, the potential level of the internal node ND further increases and the potential level of the reference voltage Vref3 also increases.

The external power supply voltage VCCE is supplied at a certain level and the potential level thereof is lowered at a power down period. Accordingly, the potential level of the internal node ND, namely, the potential level of the reference voltage Vref3 may decrease. When the external power supply voltage VCCE decreases to the second set level B or lower, the potential level of the reference voltage Vref3 received from the voltage dividing circuit 121 decreases and the transistor N12 of the output node control circuit 122 is turned off. Accordingly, the internal node NE is electrically blocked from the ground power supply voltage Vss and the potential level thereof is increased by the external power supply voltage VCCE. Accordingly, the buffer circuit 123 buffers the potential level of the internal node NE to generate a power-on reset signal POR with a high logic level, and outputs the power-on reset signal POR.

As described above, in an embodiment of the present disclosure, the resistance value of the first resistor circuit 121A may be set differently at the time of a power up operation and power down operation. For example, when the resistance value at the time of power down operation is controlled to be lower than that at the time of the power up operation, it is possible to set so that the potential level (i.e., the first set level A) of the external power supply voltage at the time when the power-on reset signal POR is transitioned to a low level at the time of power up operation is higher than the potential level (i.e., the second set level B) of the external power supply voltage at the time when the power-on reset signal POR is transitioned to a high level at the time of the power down operation.

In addition, in an embodiment of the present disclosure, the resistance value of the first resistor circuit 121A may be adjusted according to the down signal POR_DOWN outputted according to a program state of the CAM cells included in the CAM circuit 124. Accordingly, the down signal POR_DOWN may be outputted as a multi-bit signal of which the number of bits is greater than 1 by increasing the number of CAM cells, which results an increase in number of programmable bits, and the resistance value may be further fragmented by increasing the number of transistors P21 included in the first resistor circuit 121A.

Figure 8:
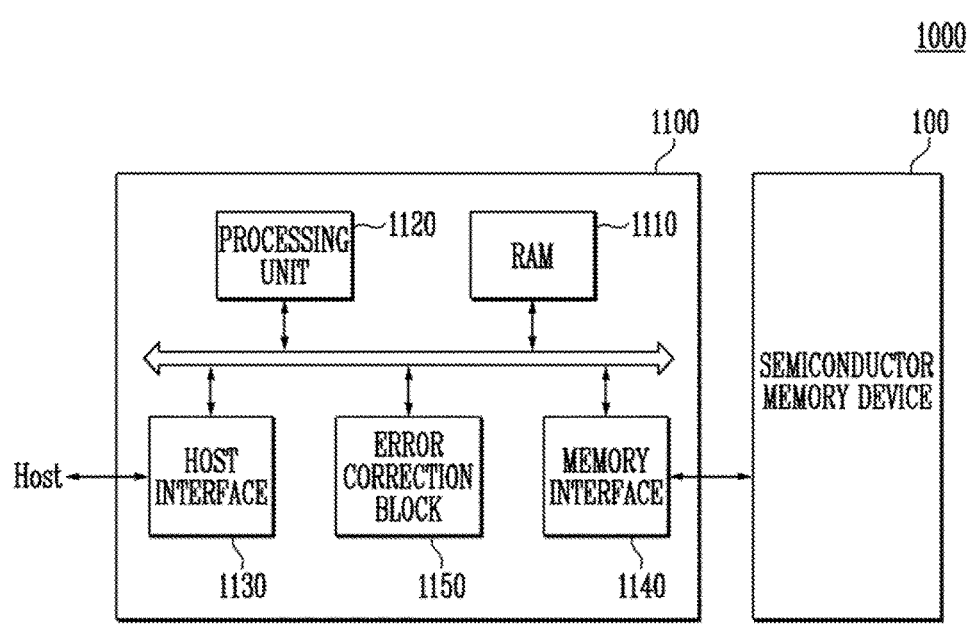
FIG. 8 is a block diagram illustrating a memory system including the semiconductor memory device of FIG. 1, according to an embodiment of the present disclosure.

FIG. 8 is a block diagram illustrating a memory system 1000 including the semiconductor memory device 100 of FIG. 1, according to an embodiment of the present disclosure.

Referring FIG. 8, the memory system 1000 includes the semiconductor memory device 100 and a controller 1100.

The semiconductor memory device 100 may be similarly configured and operate as the semiconductor device described in relation to FIG. 1. Hereinafter, the repetitive explanations will be omitted.

The controller 1100 is coupled with a host and the semiconductor memory device 100. In response to a request from the host, the controller 1100 accesses the semiconductor memory device 100. For example, the controller 1100 may control read, write, erase, and background operations for the semiconductor memory device 100. The controller 1100 provides an interface between the host and the semiconductor memory device 100. The controller 1100 drives firmware for controlling the semiconductor memory device 100.

The controller 1100 includes a random access memory (RAM) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host, and a buffer memory between the semiconductor memory device 100 and the host. The processing unit 1120 controls an entire operation of the controller 1100. In addition, the controller 1100 may temporarily store program data provided from the host at a write operation.

The host interface 1130 may include a protocol for performing data exchange between the host and controller 1100. As an exemplary embodiment, the controller 1200 may communicate with the host through at least one of various interface protocols including a Universal Serial Bus (USB) protocol, multimedia card (MMC) protocol, peripheral component interconnection (PCI) protocol, PCI-express (PCI-E) protocol, Advanced Technology Attachment (ATA) protocol, Serial-ATA protocol, Parallel-ATA protocol, small computer small interface (SCSI) protocol, enhanced small disk interface (ESDI) protocol, Integrated Drive Electronics (IDE) protocol, private protocol, and the like.

The memory interface 1140 interfaces the semiconductor memory device 100. For example, the memory interface 1140 may include a NAND interface or a NOR interface.

The error correction block 1150 detects and corrects errors in data received from the semiconductor memory device 100 by using an error correction code. The processing unit 1120 may adjust a read voltage according to an error detection result from the error correction block 1150, and control the semiconductor memory device 100 to perform re-reading. In an embodiment, the error correction block 1150 may be provided as an element of the controller 1100.

The controller 1100 and the semiconductor memory device 100 may be integrated into one semiconductor device. In an embodiment, the controller 1100 and the semiconductor memory device 100 may be integrated to one semiconductor device to form a memory card. For example, the controller 1100 and the semiconductor memory device 100 may be integrated to one semiconductor device to form a memory card including a personal computer memory card international association (PCMCIA), compact flash card (CF), smart media card (SMC), memory stick multimedia card (MMC, RS-MMC, or MMCmicro), SD card (SD, miniSD, microSD, or SDHC), universal flash storage (UFS) or the like.

The controller 1100 and the semiconductor memory device 100 may be integrated to one semiconductor device to form a solid state drive (SSD). The SSD includes a storage device configured to store data in a semiconductor memory. When the memory system 1000 is used as the SSD, an operation speed of the host coupled to the memory system 2000 may be improved substantially.

As another example, the memory system 1000 may be provided as one of various elements of an electronic device including a computer, Ultra Mobile PC (UMPC), workstation, net-book, Personal Digital Assistants (PDA), portable computer, web tablet, wireless phone, mobile phone, smart phone, e-book, portable multimedia player (PMP), game console, navigation device, black box, digital camera, 3-dimensional television, digital audio recorder, digital audio player, digital picture recorder, digital picture player, digital video recorder, digital video player, device capable of transmitting/receiving information in an wireless environment, one of various devices for forming a home network, one of various electronic devices for forming a computer network, one various electronic devices for forming a telematics network, RFID device, one of various elements for forming a computing system, or the like.

In an embodiment, the semiconductor memory device 100 or the memory system 1000 may be embedded as various types of packages. For example, the semiconductor memory device 100 or the memory system 1000 may be packaged to be embedded in a type including Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 9:
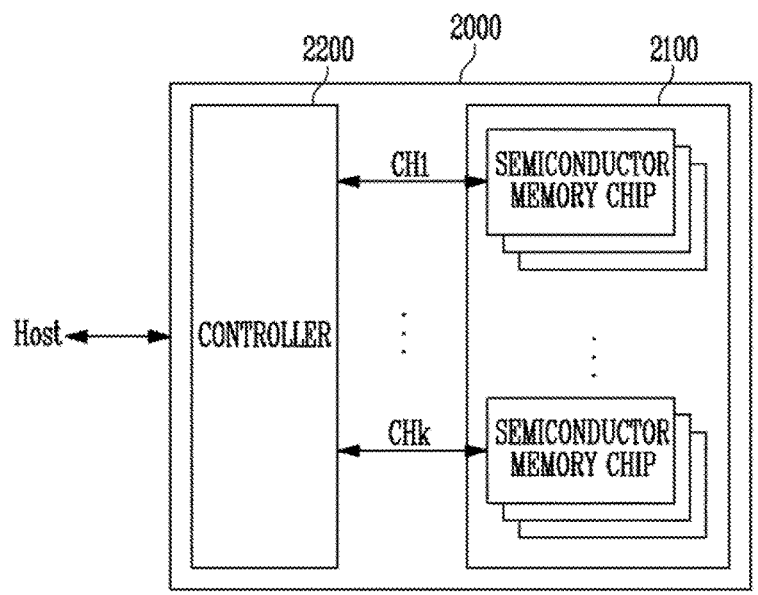
FIG. 9 is a block diagram illustrating an application example of the memory system of FIG. 8, according to an embodiment of the present disclosure.

FIG. 9 illustrates a memory system 2000 as an application example 2000 of the memory system of FIG. 8.

Referring FIG. 9, the memory system 2000 includes a semiconductor memory device 2100 and a controller 2200. The semiconductor memory device 2100 includes a plurality of memory chips. The plurality of semiconductor memory chips is divided into a plurality of groups.

In FIG. 9, it is illustrated that each of the plurality of groups communicates with the controller 2200 through first to k-th channels CH1 to CHk. Each semiconductor memory chip is configured to identically operate to one of the semiconductor memory device 100 described in relation to FIG. 1.

Each group communicates with the controller 2200 through one common channel. The controller 2200 may be configured identically to the controller 1100 described in relation to FIG. 8 and may control a plurality of memory chips of the semiconductor memory device 2100 through the plurality of channels CH1 to CHk.

Figure 10:
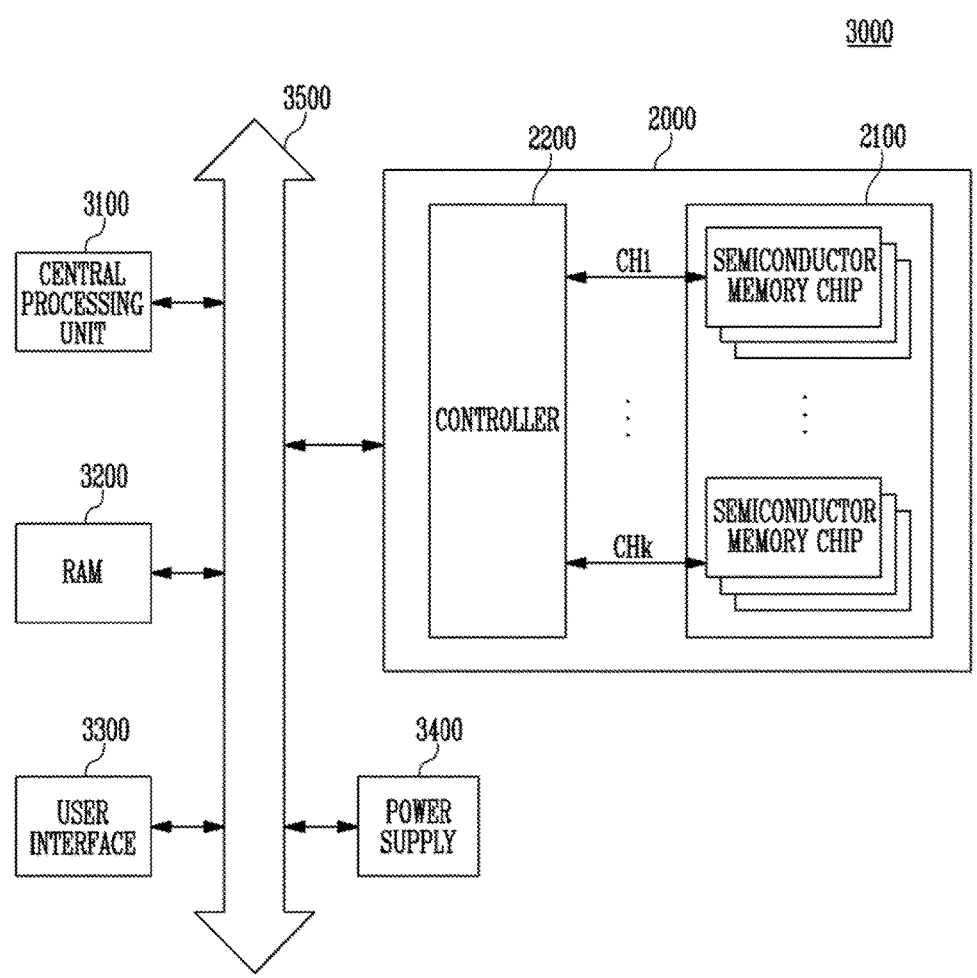
FIG. 10 is a block diagram illustrating a computing system including the memory system of FIG. 9, according to an embodiment of the present disclosure.

FIG. 10 is a block diagram illustrating a computing system 3000 including the memory system 2000 explained in relation to FIG. 9.

Referring to FIG. 10, the computing system 3000 includes a central processing unit 3100, a random access memory (RAM) 3200, a user interface 3300, a power supply 3400, a system bus 3500, and the memory system 2000.

The memory system 2000 is electrically coupled to the central processing unit 3100, the RAM 3200, the user interface 3300, and the power supply 3400 through the system bus 3500. Data provided through the user interface 3300 or processed by the central processing unit 3100 is stored in the memory system 2000.

In FIG. 10, the semiconductor memory device 2100 is illustrated to be coupled to the system bus 3500 through the controller 2200. However, the semiconductor memory device 2100 may be directly coupled to the system bus 3500 in which case a function of the controller 2200 may be performed by the central processing unit 3100 and the RAM 3200.

In FIG. 10, the computing system 3000 is shown to employ the memory system 2000 of FIG. 9. However, in another embodiment, the memory system 2000 may be replaced with the memory system 1000 described in relation to FIG. 7. In yet another embodiment, the computing system 3000 may employ both of the memory systems 1000 and 2000 described in relation to FIGS. 9 and 8.

According to embodiments of the present disclosure, at the time of POWER DOWN of an external power supply voltage, a stable word line discharge operation may be performed to reduce an error in a semiconductor memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A power-on reset circuit comprising:
a voltage dividing circuit suitable for dividing an external power supply voltage according to a resistance ratio to output a reference voltage;
an output node control circuit suitable for controlling a potential level of an output node to an external power supply voltage level or a ground power supply voltage level in response to the reference voltage; and
a buffer circuit suitable for buffering the potential level of the output node to output a power-on reset signal,
wherein the resistance ratio in a power up period is different from the resistance ratio in a power down period.

2. The power-on reset circuit according to claim 1, wherein the voltage dividing circuit adjusts the resistance ratio in response to the power-on reset signal.

3. The power-on reset circuit according to claim 1, wherein the voltage dividing unit comprises first and second resistor circuits.

4. The power-on reset circuit according to claim 3, wherein a resistance value of the first resistor circuit varies in response to the power-on reset signal.

5. The power-on reset circuit according to claim 3, wherein a resistance value of the first resistor circuit decreases in response to the power-on reset signal.

6. The power-on reset circuit according to claim 3, wherein the first resistor circuit comprises:
a plurality of resistors serially coupled between a terminal for the external power supply voltage and a first internal node; and
a transistor coupled between any one of nodes between the plurality of resistors and the terminal for the external power supply voltage,
wherein the transistor is turned on or off in response to the power-on reset signal.

7. The power-on reset circuit according to claim 1, wherein the output node control circuit increases the potential level of the output node when the reference voltage is lower than a set voltage, and discharges the potential level of the output node when the reference voltage is higher than the set voltage.

8. The power-on reset circuit according to claim 1, wherein the output node control circuit comprises:
a plurality of resistors serially coupled between a terminal for the external power supply voltage and the output node; and
a transistor coupled between the output node and a terminal for a ground power supply voltage,
wherein the transistor operates in response to the reference voltage.

9. A power-on reset circuit comprising:
a content addressable memory (CAM) circuit configured to output a down signal in response to a power-on reset signal;
a voltage dividing circuit suitable for dividing an external power supply voltage according to a resistance ratio to output a reference voltage, the resistance ratio being changed in response to the down signal;
an output node control circuit suitable for controlling a potential level of an output node to an external power supply voltage level or a ground power supply voltage level in response to the reference voltage; and
a buffer circuit suitable for buffering the potential level of the output node to output the power-on reset signal,
wherein the CAM circuit controls a logic level of the down signal according to a program state of a content addressable memory (CAM) cell among a plurality of memory cells.

10. The power-on reset circuit according to claim 9, wherein a potential level of the reference voltage output in a power up period is different from a potential level of the reference voltage in a power down period.

11. The power-on reset circuit according to claim 9, wherein the voltage dividing unit comprises first and second resistor circuits.

12. The power-on reset circuit according to claim 11, wherein a resistance value of the first resistor circuit decreases in response to the down signal.

13. The power-on reset circuit according to claim 9, wherein the output node control circuit increases the potential level of the output node when the reference voltage is lower than a set voltage, and discharges the potential level of the output node when the reference voltage is higher than the set voltage.

14. A semiconductor memory device comprising:
- a power-on reset circuit configured to output a power-on reset signal with a first logic level when an external power supply voltage increases to a first set level or higher in a power up period, and to output the power-on reset signal with a second logic level when the external power supply voltage decreases to a second set level or lower in a power down period; and
- an external voltage detecting unit configured to output a detection signal when the external power supply voltage decreases to a third set level or lower.

15. The semiconductor memory device according to claim 14, further comprising:
- a control logic configured to generate an enable signal in response to the power-on reset signal; and
- a discharge unit coupled to word lines of memory cells, configured to discharge a potential level of the word lines in response to the enable signal and detection signal.

16. The semiconductor memory device according to claim 14, wherein the second set level is lower than the first set level.

17. The semiconductor memory device according to claim 14, wherein the third set level is higher than the second set level.

18. The semiconductor memory device according to claim 14, wherein the power-on reset circuit comprises:
- a voltage dividing unit suitable for dividing the external power supply voltage according to a resistance ratio to output a reference voltage;
- an output node control circuit suitable for controlling a potential level of an output node to an external power supply voltage level or a ground power supply voltage level in response to the reference voltage; and
- a buffer circuit suitable for buffering the potential level of the output node to output the power-on reset signal,
- wherein the resistance ratio in a power up period is different from the resistance ratio in a power down period.

19. The semiconductor memory device according to claim 14, wherein the power-on reset circuit comprises:
- a content addressable memory (CAM) circuit configured to output a down signal in response to the power-on reset signal;
- a voltage dividing circuit suitable for dividing an external power supply voltage according to a resistance ratio to output a reference voltage, the resistance ratio being changed in response to the down signal;
- an output node control circuit suitable for controlling a potential level of an output node to an external power supply voltage level or a ground power supply voltage level in response to the reference voltage; and
- a buffer circuit suitable for buffering the potential level of the output node to output the power-on reset signal,
- wherein the content addressable memory (CAM) circuit controls a logic level of the down signal according to a program state of a content addressable memory (CAM) cell among a plurality of memory cells.

20. The semiconductor memory device according to claim 19, wherein, in the voltage dividing circuit, a potential level of the reference voltage output in the power up period is different from a potential level of the reference voltage output in a power down period.

* * * * *